(12) United States Patent
Williams et al.

(10) Patent No.: US 12,502,885 B2
(45) Date of Patent: *Dec. 23, 2025

(54) DUAL PHOTOINITIATED NANOCOMPOSITE-INK PRINTING

(71) Applicant: Vadient Optics, LLC, Beaverton, OR (US)

(72) Inventors: George Williams, Vashon, WA (US); John Paul Harmon, Albany, OR (US); Charles G. Dupuy, Corvalis, OR (US)

(73) Assignee: Vadient Optics, LLC, Beaverton, OR (US)

( * ) Notice: Subject to any disclaimer, the term of this patent is extended or adjusted under 35 U.S.C. 154(b) by 90 days.

This patent is subject to a terminal disclaimer.

(21) Appl. No.: 18/194,984

(22) Filed: Apr. 3, 2023

(65) Prior Publication Data

US 2024/0017542 A1    Jan. 18, 2024

Related U.S. Application Data

(63) Continuation-in-part of application No. 15/099,403, filed on Apr. 14, 2016, now Pat. No. 11,618,249.

(51) Int. Cl.
| | |
|---|---|
| *B41J 2/01* | (2006.01) |
| *C09D 11/101* | (2014.01) |
| *C09D 11/322* | (2014.01) |
| *C09D 11/38* | (2014.01) |
| *C09D 11/40* | (2014.01) |
| *C09D 11/50* | (2014.01) |

(52) U.S. Cl.
CPC .............. *B41J 2/01* (2013.01); *C09D 11/101* (2013.01); *C09D 11/322* (2013.01); *C09D 11/38* (2013.01); *C09D 11/40* (2013.01); *C09D 11/50* (2013.01)

(58) Field of Classification Search
CPC ........ B41J 2/01; C09D 11/101; C09D 11/322; C09D 11/38; C09D 11/40; C09D 11/50;
(Continued)

(56) References Cited

U.S. PATENT DOCUMENTS

| 10,322,544 B1 | 6/2019 | Simpson | |
|---|---|---|---|
| 2016/0067974 A1* | 3/2016 | Williams | B41J 2/175 347/20 |

(Continued)

FOREIGN PATENT DOCUMENTS

| CN | 108139665 B | 7/2022 |
|---|---|---|
| CN | 113993906 B | 9/2024 |

(Continued)

OTHER PUBLICATIONS

Taiwan Intellectual Property Office, Office Action and Search Report Issued in Application No. 113110746, Apr. 18, 2025, 28 pages.

(Continued)

*Primary Examiner* — Jason S Uhlenhake
*Assistant Examiner* — Alexander D Shenderov
(74) *Attorney, Agent, or Firm* — Alleman Hall & Tuttle LLP (57) ABSTRACT

A method for forming a heterogeneous or gradient dielectric-property element comprises: (a) providing a plurality of solution-based feedstocks, each including an organic matrix, wherein at least one of the feedstocks includes a nanoparticle filler dispersed within the organic matrix, the feedstocks comprising a first ink having a first photosensitive entity and one or more additional feedstocks having other photosensitive entities, the first and subsequent feedstocks having at least one different photosensitization absorption band, such that spectrally discrete exposure results in different degrees of curing; (b) providing an electromagnetic (EM) source configured to polymerize one or more of the feedstocks; (c) depositing the feedstocks in a plurality of layers; and (e) curing at least a portion of the plurality of feedstocks, wherein deposition and subsequent curing results in regions where complex dielectric properties are (Continued)

different within or between at least one of the plurality of layers.

21 Claims, 5 Drawing Sheets

(58) Field of Classification Search
CPC ....... B29C 64/112; B33Y 10/00; B33Y 80/00; G03F 7/0005; G03F 7/0037; G03F 7/0047; G03F 7/027; G03F 7/029; G03F 7/031; G03F 7/095; G03F 7/11
USPC .......................................................... 347/102
See application file for complete search history.

(56) References Cited

U.S. PATENT DOCUMENTS

| | | | |
|---|---|---|---|
| 2016/0121601 A1* | 5/2016 | Williams | .............. C09D 11/52 347/20 |
| 2017/0297953 A1 | 10/2017 | Dupuy et al. | |
| 2019/0054659 A1 | 2/2019 | Tseng et al. | |
| 2019/0160539 A1 | 5/2019 | Lei et al. | |
| 2020/0282638 A1 | 9/2020 | Holt et al. | |
| 2022/0203609 A1 | 6/2022 | Rolland et al. | |
| 2022/0305723 A1 | 9/2022 | Garmshausen et al. | |
| 2024/0017542 A1 | 1/2024 | Williams et al. | |

FOREIGN PATENT DOCUMENTS

| | | |
|---|---|---|
| TW | 201930054 A | 8/2019 |
| WO | 2019203811 A1 | 10/2019 |

OTHER PUBLICATIONS

ISA United States Patent and Trademark Office, International Search Report and Written Opinion Issued in Application No. PCT/US2024/021521, Oct. 28, 2024, WIPO, 15 pages.

* cited by examiner

DUAL PHOTOINITIATED NANOCOMPOSITE-INK PRINTING

CROSS REFERENCE TO RELATED APPLICATIONS

This application is a continuation-in-part of U.S. patent application Ser. No. 15/099,403, filed Apr. 14, 2016, the entirety of which is hereby incorporated herein by reference for all purposes.

GOVERNMENT INTEREST STATEMENT

This invention was made with government support under Contract FA8650-12-C-7226 awarded by the United States Special Operations Command. The government has certain rights in the invention.

TECHNICAL FIELD OF THE DISCLOSURE

The present disclosure relates in general to additive manufactured optics. This application relates in particular to depositing and curing nanocomposite inks to form freeform gradient refractive index optics (GRIN) and other 3D freeform dielectric structures.

BACKGROUND DISCUSSION

Inkjet printing allows manufacture of dielectric elements, such as an optical element, with volumetrically varying complex dielectric properties, freeform surface curvatures, and combinations thereof. In a typical printing process, an inkjet printer deposits polymer droplets. A curing mechanism, typically ultraviolet or infrared optical sources, cures the deposited droplets. This process is repeated thereby gradually building the dielectric element. In some processes, a border or mold is provided to contain the printed element.

This application relates to another approach.

SUMMARY OF THE DISCLOSURE

The present disclosure is directed additively manufacturing a gradient refractive index dielectric element in a deposition and photo-polymerization process. In one aspect the method comprises providing a plurality of complex-dielectric inks that are inkjet printable including a nanocomposite ink with an organic matrix and a nanoparticle filler dispersed within. The plurality of complex-dielectric inks have a first complex-dielectric ink having a first photoinitiator and a second complex dielectric-ink with a second photoinitiator. The first and second complex-dielectric inks have different wavelength selective photo-polymerization absorption bands such that spectrally discrete exposure results in different degrees of polymerization of the first and second complex-dielectric ink. The method further comprises providing an optical source to polymerize the complex-dielectric inks, depositing droplets of the plurality of complex-dielectric inks and curing the plurality of complex-dielectric ink, wherein deposition of the plurality of layers result in a volumetric nanoparticle concentration gradient.

In another aspect the depositing droplets of the plurality of complex dielectric-inks forming a plurality of layers, at least one the plurality of layers having a layer perimeter border defining an infill area within the layer perimeter border, wherein either the layer perimeter border is at least partially cured before the infill area is deposited or the layer perimeter border is at least partially cured before the infill is at least partially cured; and wherein deposition of the plurality of layers result in a volumetric nanoparticle concentration gradient.

BRIEF DESCRIPTION OF THE DRAWINGS

The accompanying drawings, which are incorporated in and constitute a part of the specification, schematically illustrate embodiments of the present disclosure, and together with the general description given above and the detailed description of preferred methods and embodiment given below, serve to explain principles of the present disclosure.

FIG. 3A is a partial cross-section view of an optical-element in process illustrating a method of manufacturing including providing a plurality of complex dielectric-ink that are inkjet printable including a nanocomposite ink with an organic matrix and a nanoparticle filler dispersed within; the plurality of complex-dielectric ink including a first complex-dielectric ink having a first photoinitiator and a second complex-dielectric ink with a second photoinitiator; the first and second complex dielectric-inks having different wavelength selective photo-polymerization absorption bands such that spectrally discrete exposure results in different degrees of polymerization of the first and second complex-dielectric ink; providing an optical source to polymerize the complex-dielectric ink, depositing droplets of the plurality of complex-dielectric ink and curing the plurality of complex-dielectric inks, wherein deposition of the plurality of layers results in a volumetric nanoparticle concentration gradient.

DETAILED DESCRIPTION

Referring now to the drawings, wherein like components are designated by like reference numerals. Methods of manufacture and various embodiments of the present disclosure are described further herein below.

A method of additively manufacturing a gradient dielectric element in a deposition and photo-polymerization process includes providing a plurality of complex dielectric-inks that are inkjet printable including a nanocomposite ink with an organic matrix and a nanoparticle filler dispersed within. The plurality of complex dielectric-ink have a first complex-dielectric ink having a first photoinitiator and a second complex-dielectric ink with a second photoinitiator. The first and second complex-dielectric ink having different wavelength selective photo-polymerization absorption bands such that spectrally discrete exposure results in different degrees of polymerization of the first and second complex-dielectric ink. The method further comprises providing an optical source to polymerize the complex-dielectric inks, depositing droplets of the plurality of complex-dielectric inks and curing the plurality of complex-dielectric ink, wherein deposition of the plurality of layers results in a volumetric nanoparticle concentration gradient.

The plurality of complex-dielectric inks comprise of an organic matrix with viscosities suitable for microchannel solution based deposition, including inkjet printing. At least one of the plurality of complex dielectric-inks is nanocomposite ink with a nanoparticle dispersed within the organic matrix. The first, second, both, or any other of the complex-dielectric inks can be nanocomposite inks. Nonlimiting examples of suitable organic matrix materials include are cyanoethyl pullulan (CYELP), polyacrylate, hexanediol diacrylate (HDODA), polymethyl methacrylate (PMMA), diethylene glycol diacrylate (DEGDA), cellulose, and organic resins such as from the SU-8 series resists.

Nonlimiting examples of suitable nanoparticle filler material include materials selected from selected from BeO, $Al_2O_3$, SiC, ZnO, $SiO_2$, ZnS, $ZrO_2$, $YVO_4$, $TiO_2$, $CuS_2$, CdSe, PbS, $TeO_2$, MgO, AlN, $LaF_3$, GaSbO, nano-Diamond, $ThF_4$, $HfO_2:Y_2O_3$, $Yb_2O_3$, $Dy_2O_3$, $ZrO_2:Y_2O_3$, $Si_3N_4$, $Y_2O_3$, KBr, $Ta_2O_5$, $HfO_2$, AlGaP, SiGe, GaAs, Au, Ag, LiF, $MoS_2$, or combinations thereof, including those with core, core/shell, and core/shell/ligand architectures. The nanoparticles can be selected for their material properties including mechanical, electrical, thermal, and optical properties including real, imaginary, and nonlinear properties. In some methods, the plurality of complex-dielectric inks comprise a plurality of nanocomposite inks, the plurality of nanocomposite inks having different finite concentrations of the nanoparticle fillers.

Photoinitiators are molecules that polymerize the organic matrix when exposed to electromagnetic radiation. Absorption of electromagnetic radiation releases reactive species that cross-link monomers, oligomer, and nanoparticles fillers. Typically, photoinitiators are UV activated. Nonlimiting examples of suitable photoinitiators include acetophenone, anisoin, anthraquinone, anthraquinone-2-sulfonic acid sodium salt monohydrate, tricarbonylchromium, benzyl, benzoin, benzoin ethyl ether, benzoin isobutyl ether, benzophenone, benzophenone/I-hydroxycyclohexyl phenyl ketone, 3,3',4,4'-benzophenonetetracarboxylic, 4-benzoylbiphenyl, 2-benzyl$^2$-(dinethlanmino)-4-morpholinobutyrophenone, 4,4'-bis(diethylamino)benzophenone, camphorquinone, 2-chlorothiozanthen-9-one, (cumene)cyclopentadienyliron (II)hexafluorophosphate, dibenzosuberenone, 2,2-diethoxyacetophenone, 4,4'-dihydroxybenzophenone, 2,2-dimethoxy-2-phenylacetophenone, 4-(dimethylamino) benzophenone, 4,4'-dimethylbenzil, 2,5-dimenthylbenzophenone, 3,4-dimethylbenzophenone, diphenyl(2,4,6trimehtylbenzoyl)phosphine oxide/2-hydroxy-2-methylpropiophenone, 4'-ethoxyacetophenone, 2-ethylanthraquinone, ferrocene, 3'-hydroxyacetophenone, 4'-hydroxyacetophenone, 3-hydroxybenzophenone, 4-hydroxybenzophenone,1-hydroxycyclohexyl phenyl ketone, 2-hydroxy-2-methylproppiophenone, 2-methylbenzophenone, 3-methylbenzophenone, methybenzoylformate, 2-methyl-4'-(methylthio)-2-morpholinopropio-phenone, phenanthrenequinone, 4'-phenozyacetophenone, thiozanthen-9-one, triarylsulfonium hexafluoroantimonate salts, triarylsulfonium hexafluorophosphate salt.

The photoinitiator determines the degree of polymerization under a given photo-dosage. Within any of the plurality of complex-dielectric inks, the photoinitiator can vary by the material type and concentration. A plurality of photoinitiators can be used. The photoinitiator characteristics determine, in part, the depth dependent spectral absorbance and degree of polymerization for a given dosage of electromagnetic radiation by the optical source.

In addition to depositing the plurality of complex-dielectric inks, the disclosed methods can also further comprise depositing a radical reaction inhibitor. The radical reaction inhibitor restricts the spread of polymerization during photocuring of the plurality of complex-dielectric inks. For instance, when spatially localized curing is desired, the radical reaction inhibitor can be deposited to control the extent of the curing process. The radical reaction inhibitor can be deposited alone, or incorporated within one of the plurality of complex-dielectric inks.

The complex-dielectric inks can be formulated by organic matrix, photoinitiator type and concentration, the nanoparticle material type, and nanoparticle size distribution. As aforementioned the complex-dielectric inks that contain nanoparticles are generally referred to as nanocomposite inks. Material properties of the dielectric device can be changed based on the nanoparticle loading and concentration gradient. The disclosed methods are particular well suited for manufacturing an optical-element to manipulate UV, visible, NIR, IR, microwave, millimeter, radio frequencies and combinations thereof. For instance, the refractive, reflective, and absorptive properties are influenced by the formulation. In on instance, the refractive index of the nanocomposite inks is influenced by the formulation. An approximation can be calculated based on the summation by percent volume of the optical properties of the organic matrix and the nanoparticles, although direct measurement is a preferred method of determining the refractive index for any given nanocomposite-ink formation. For a nanocomposite ink with one nanoparticle type, the refractive index is given by the following equation:

$$n_{eff}(\lambda) = V\%_{NP} \times n_{NP}(\lambda) + V\%_{OM} \times n_{OM}(\lambda)$$

where $n_{eff}(\lambda)$ is the effective index of the nanocomposite ink, $V\%_{NP}$ is the percent volume of the nanoparticles $n_{NP}(\lambda)$ is the refractive index of the nanoparticles, $V\%_{OM}$ is the percent volume of the organic matrix, and $n_{OM}(\lambda)$ is the refractive index of the organic matrix. Additionally, nanoparticles can be added and percent volume and refractive index included in the equation. This formula can be similarly applied to calculate the permittivity, permeability, or other dielectric property of the composite.

In general, the nanocomposite inks loaded with the nanoparticles will have a volume proportional increase of refractive index. For instance, a nanocomposite ink with nanoparticles that have a high-index relative to the organic matrix will have increased refractive index with increased nanoparticle concentration. Likewise, a nanocomposite ink with a low-index nanoparticle, for instance a hollow buckeyball, comprised mostly of air, with an optical refractive index (n) of n=1, results in a nanocomposite ink with a refractive index lower than the organic matrix.

The optical source can be any optical source emitting electromagnetic radiation within the absorbance spectrum of the photoinitiators. Preferably, the electromagnetic source is either spectrally tunable or otherwise a plurality of optical sources are used. The optical sources can be broadband emission sources or spectrally discrete. Suitable optical sources include filament based sources, flash lamps, light emitting diodes (LED), laser diodes (LD), lasers, microwave sources, or combinations thereof.

Figure 1:
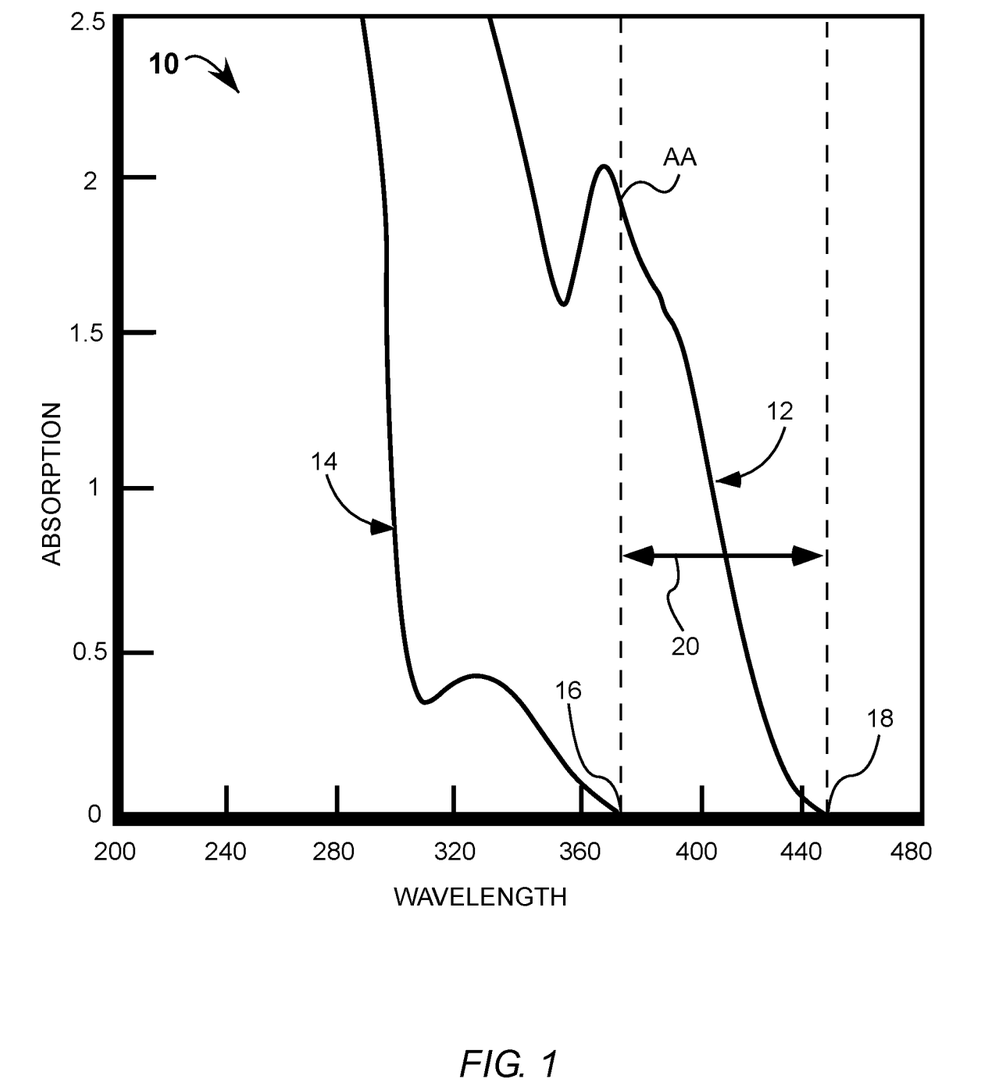
FIG. 1 is a graphical representation of the absorption spectrum of a first photoinitiator and a second photoinitiator dispersed within a first complex-dielectric ink and a second complex-dielectric ink, respectively, wherein the first complex dielectric-ink is curable by a portion of the electromagnetic spectrum that does not cure the second complex-dielectric ink.

Referring to FIG. 1, an absorption spectrum 10 of a first complex dielectric-ink with a first photoinitiator and a second complex-dielectric ink with a second photoinitiator wherein the first complex-dielectric ink is curable by exposure to a portion of the electromagnetic spectrum that does not cure the second nanocomposite ink. Here, the first photoinitiator is Irgacure 819 and the second photoinitiator is Irgacure 184, or iphenyl(2,4,6-trimehtylbenzoyl)phosphine oxide/2hydroxy-2-methylpropiophenone and 1-hydroxycyclohexyl phenyl ketone, respectfully. Both photoinitiators can be obtained commercially from BASF of Ludwigshafen, Germany. The first complex-dielectric ink is characterized by an absorption curve 12 and the second complex-dielectric ink is characterized by an absorption curve 14. Absorption curve 14 has high absorption in the deep ultraviolet (DUV) becoming appreciably transparent at a transparent point 16 wherein the extinction coefficient is at about zero at about 370 nm. Absorption curve 12 has high absorption in the DUV with appreciable absorption in the blue region of the visible spectrum until a transparent point 18 at about 450 nm. Between transparent point 16 and transparent point 18 the first complex-dielectric ink has spectrally discrete photocurable region with a spectral bandwidth 20 that is about 80 nm wide from about 370 nm to about 460 nm.

Here, the first and second complex-dielectric inks allow for discrete curing. Using a wavelength tunable optical source or a plurality of spectrally discrete optical sources, the first complex-dielectric ink can be cured without curing the second complex-dielectric ink. A broadband emission source with a bandpass or long pass dielectric filter can be used to cure the first complex-dielectric ink or both the first and second complex-dielectric ink. In addition, the wavelength tunable optical source allows curing of the first and second complex-dielectric ink at various positions along the respective absorption curves, allowing control over the cure depth and degree of curing. Otherwise a plurality of spectrally discrete optical sources, such as LEDs or laser based optical sources can be used.

Figure 2:
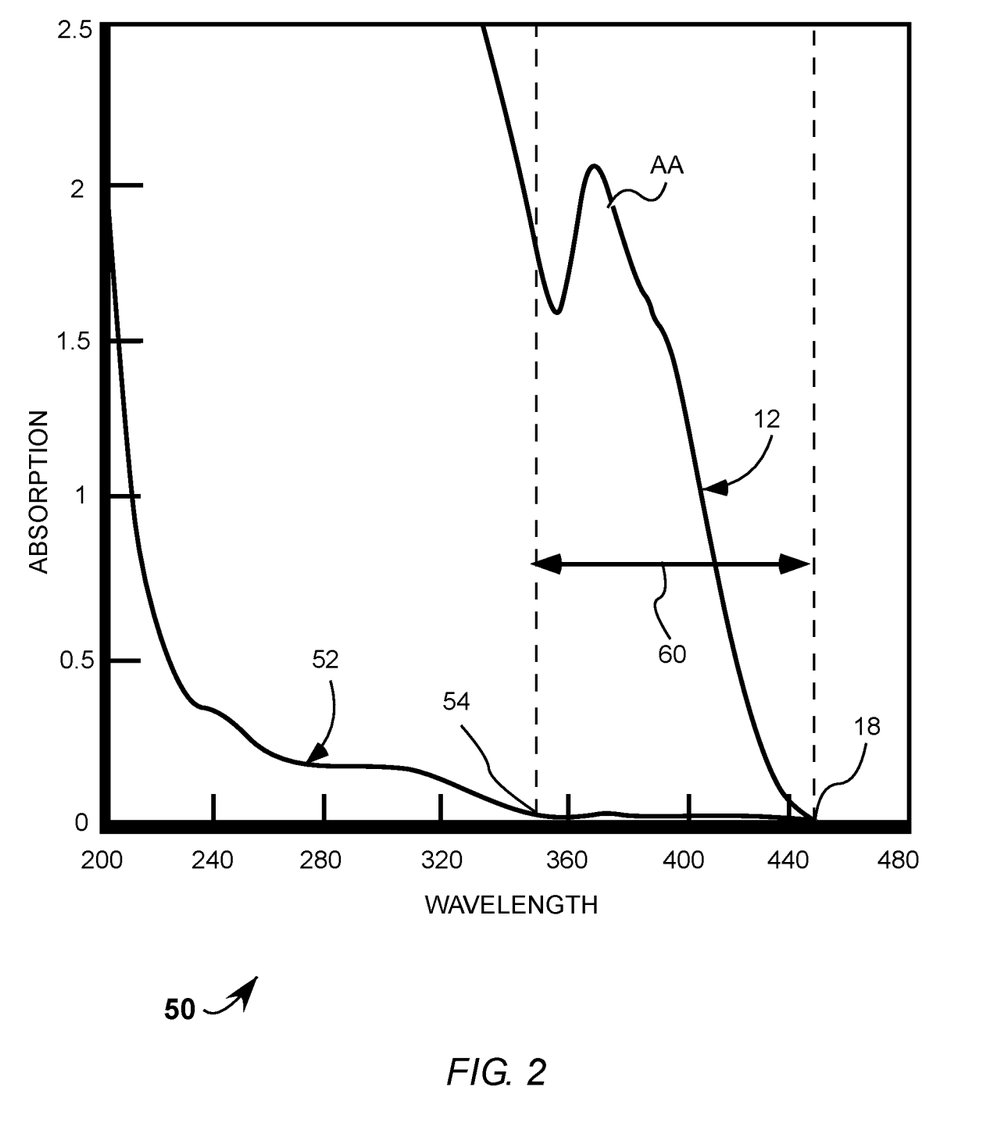
FIG. 2 is a graphical representation of the absorption spectrum of a first photoinitiator and a second photoinitiator dispersed within a first complex-dielectric ink and a second complex-dielectric ink, respectively, wherein the first and second photoinitiator are the same with different levels of concentration within the respective complex-dielectric inks, such that the first complex-dielectric ink is curable by a portion of the electromagnetic spectrum that does not substantially cure the second complex-dielectric ink.

Referring to FIG. 2, an absorption spectrum 50 of a first complex dielectric-ink with a first photoinitiator and a second complex-dielectric ink with a second photoinitiator wherein the first and second photoinitiator are the same material type with different levels of concentration within the respective complex-dielectric inks, such that the first complex-dielectric ink is curable by a portion of the electromagnetic spectrum that does not substantially cure the second nanocomposite ink.

The first complex-dielectric ink is the same as that shown in FIG. 1 with an absorption curve 12 with high absorption in the DUV, becoming transparent at transparent point 16. Here, the second complex-dielectric ink has a second photoinitiator that is the same type as the first photoinitiator with a smaller concentration such that the first complex-dielectric ink can be cured without substantially curing the second complex-dielectric ink. The second complex dielectric-ink is characterized by an absorption curve 52. Absorption curve 52 has high absorbance in the DUV from about 200 nm to about 240 nm wherein the extinction coefficient of about 0.35. The extinction ratio is substantially small at a point 54 at about 350 with an extinction coefficient less than 0.1 that transition to transparent point 18 at 450 nm. A bandwidth 60 has a bandwidth of about 100 nm wherein curing of the first complex-dielectric ink can occur without substantially curing the second complex-dielectric ink.

One preferred method of deposition of the plurality of complex dielectric-inks is inkjet printing. The plurality of complex-dielectric inks can be deposited in a composition compatible with spray nozzle or inkjet deposition systems, including those with thermal, piezo, or continuous flow printheads. The printer can have one or more printheads, each printhead containing, one, tens, or thousands of nozzles that can eject droplets ranging from sub-picoliter, tens-picoliter, or larger droplet volume.

Depending on the deposition process, the plurality of complex dielectric-inks have viscosities of about 20 CP or less, producing droplets from about 0.1 pL to about 100 pL. Interrupted continuous flow heads break up a continuous ejection out a nozzle with resonant application of a force perpendicular to the flow resulting in a repeatable, predictable stream of droplets, which can range from about 1 pL to 100 pL making use of fluids with viscosities of 200 CP or less. Droplets that are not required are deflected, using air impingement or electrostatic charge selectively applied, into a recycling channel alongside the trajectory of the droplets to be used. The nozzles should be preferably located in proximity to the substrate on which the nanocomposite ink is being printed, dependent on the deposition accuracy required. For precise deposition, the printhead should be within a centimeter or less of the substrate. Varying concentrations of nanoparticles throughout the printed layers, droplet-by-droplet, or layer-by-layer, throughout the volume of the printed dielectric element, three-dimensional dielectric property patterns are created. Using a plurality of photoinitiators that are spectrally independent allows complex spatial control over the printing process without regard to the optical source illumination spot size.

During manufacture of the dielectric element, the deposited complex dielectric-inks are positioned with respect to the optical source from selective-curing.

Selective-curing refers to applying radiation that polymerizes the organic matrix. Selective-curing can be performed locally with a spatially discrete optical source, or globally with a flood cure over the entire element. Selective-curing can partially or fully cure the complex-dielectric inks. To avoid interfaces subsequent layers are partially cured, or gelled, to allow intermixing of subsequent layers. During cure, the deposited complex-dielectric inks can be manipulated by application of an external effect such as application of an electric or magnetic field, change in ambient temperature, or change in local pressure.

Using the aforementioned nonlimiting examples of depositing and curing the complex-dielectric inks allows increased control of manufacturing spatially discrete location structures and providing more uniform curing. The methods can be used to manufacture dielectric elements and is particularly well suited for manufacturing optical-elements. Another preferred method of inkjet printing a gradient refractive index optical-element in a deposition and polymerization process comprises: providing a plurality of complex-dielectric inks that are photo inkjet printable including a nanocomposite ink with an organic matrix and nanoparticle dispersed within; depositing droplets of the plurality of complex-dielectric inks to form a plurality of layers having a layer perimeter border defining an infill area within the layer perimeter border, wherein either the layer perimeter border is at least partially cured before the infill area is deposited or the perimeter border is at least partially cured before the infill is at least partially cured; and wherein deposition of the plurality of layers result in a volumetric nanoparticle concentration gradient.

Figure 3A:
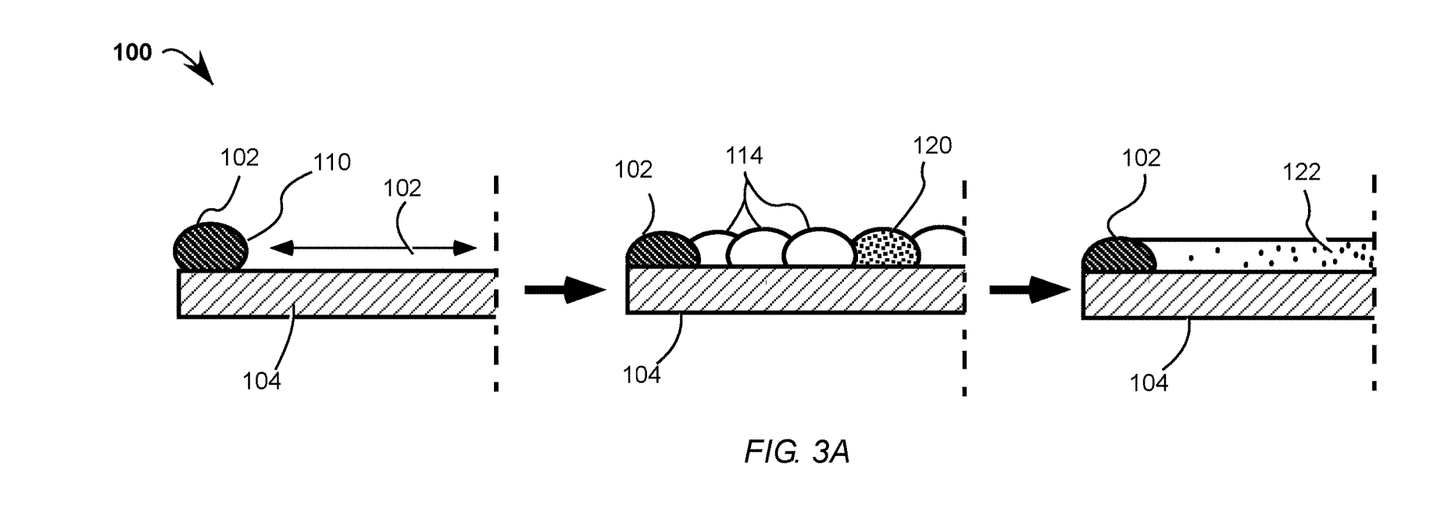
FIG. 3B is a plan view illustrating an optical-element in process shown in FIG. 3A.
Figure 3B:
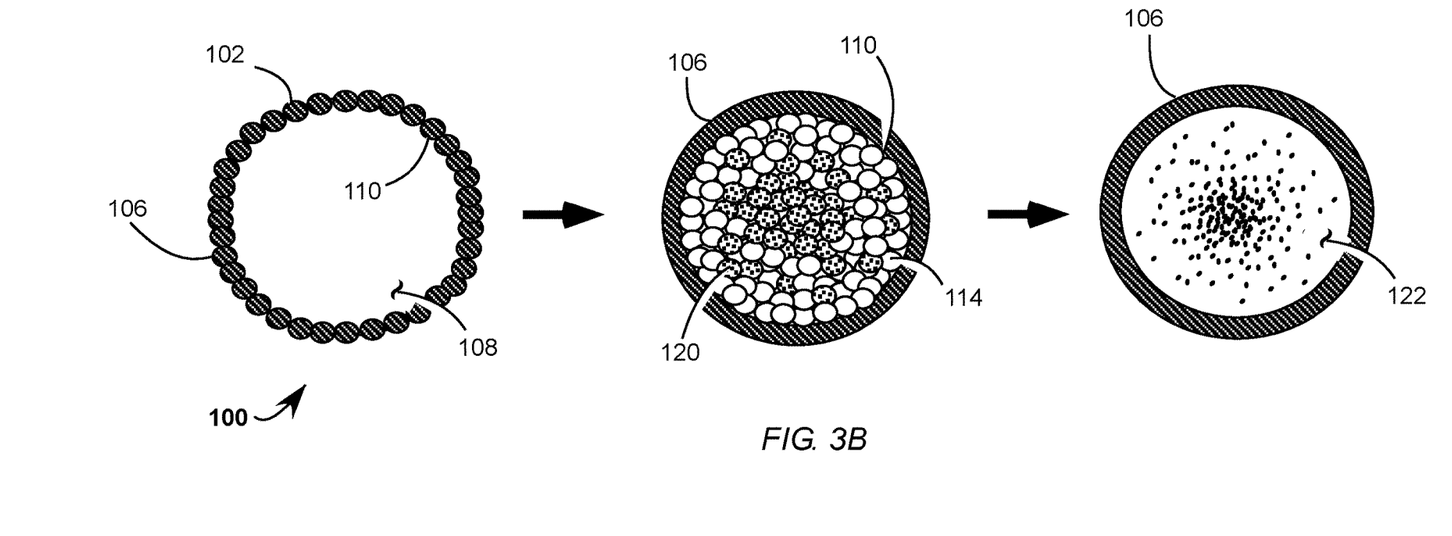

Referring to FIG. 3A and FIG. 3B, a layer perimeter border deposition process 100 is illustrated. FIG. 3A is a partial cross-section view of process 100 with FIG. 3B providing a corresponding plan view. A first complex-dielectric ink droplet 102 is deposited on a substrate 104 in a radial pattern. First complex-dielectric ink 102 has a first photoinitiator dispersed within. The radial pattern of droplets coalesces to form a layer perimeter border 106 with an infill area 108 within an inner sidewall 110 of the layer perimeter border. Layer perimeter border 106 is at least partially cured. Layer perimeter border 106 is cured by either a first optical source.

Infill area 108 is filled through deposition of a second complex dielectric-ink 114 and a third complex-dielectric ink 120. Second complex dielectric-ink 114 has no nanoparticle filler, third complex-dielectric ink 120 has a nanoparticle filler dispersed within, and both the second and third complex-dielectric ink have a second photoinitiator dispersed within. The second and third complex dielectric-inks are cooperatively deposited within infill area 108 in a gradient refractive index 122 bound by layer perimeter border 106.

After an appropriate diffusion time, the second and third nanocomposite ink are at least partially cured with a second optical-source. The process is repeated with another layer perimeter border deposited about on top of layer perimeter border 106. The next layer perimeter border is cured with the first optical source, the first optical source activating the first photoinitiator and not activating the second photoinitiator.

The layer perimeter border is advantageously at the same height as the second and third complex-dielectric ink thereby avoiding surface deformation through contact angle effects which induce meniscus bowing. In addition, the aforementioned techniques allow the printhead to remain in close proximity to the optical-element in process thereby reducing droplet deposition travel and associated angular spatial deposition error.

Figure 4:
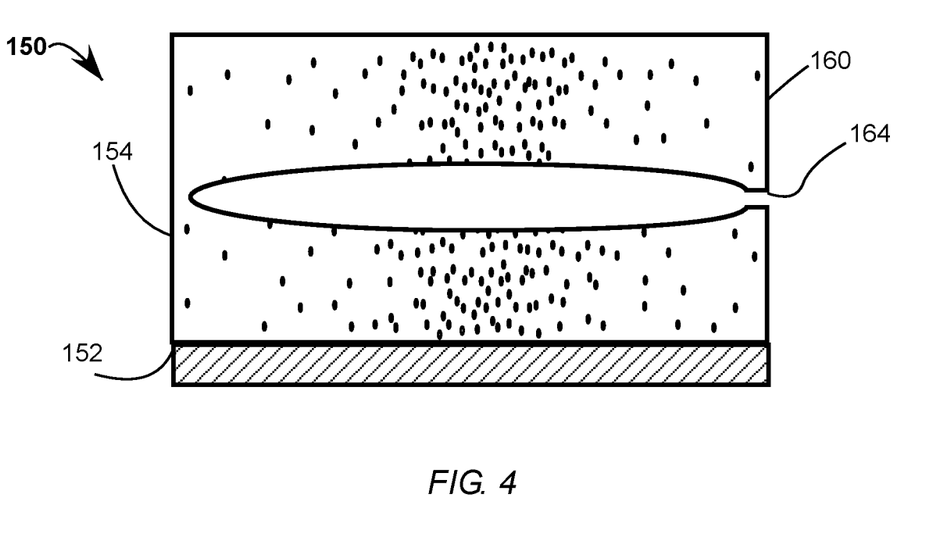
FIG. 4 is a cross-section view of an optical-element with an integrated air-spacing.

In addition to printing a layer perimeter border, the disclosed technique also allows manufacture of optical and mechanical structures. Referring to FIG. 4 an optical-element 150 has an integrated air spacing. Optical-element 150 has a substrate 152 and a nanocomposite body 154 with an air spacing 160. Air space 160 was created by depositing a complex-dielectric ink that was later evacuated through an opening 164.

Figure 5A:
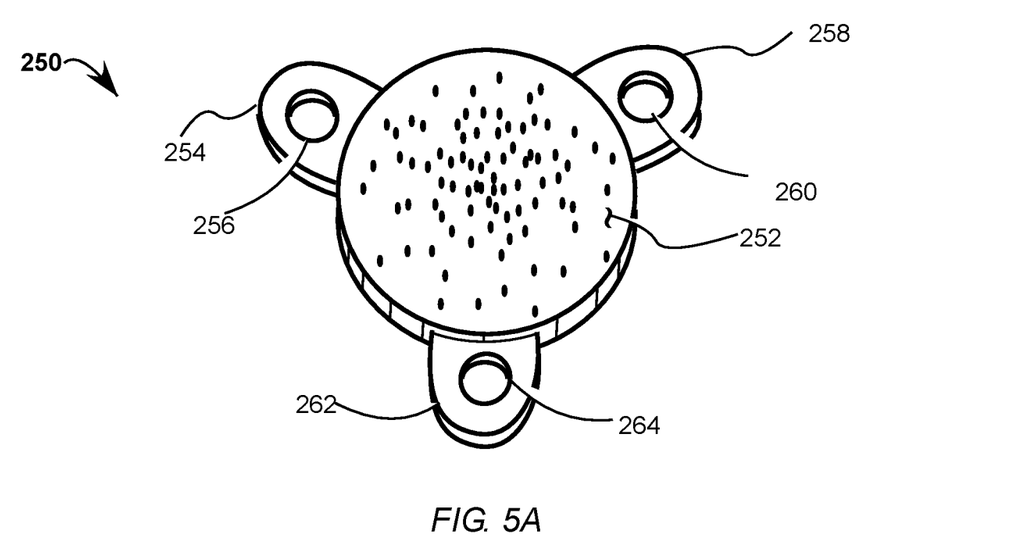
FIG. 5A is a perspective view of an optical-element with integrated mounting features.
Figure 5B:
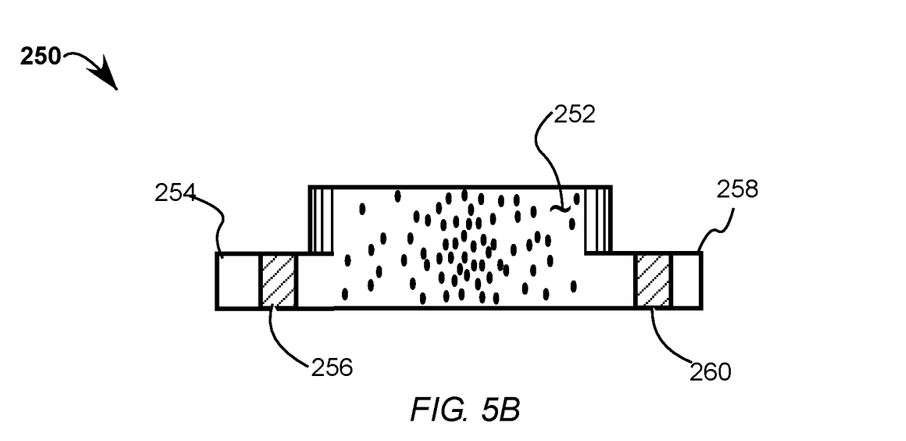
FIG. 5B is a cross-section view of the optical-element shown in FIG. 5A.

Referring to FIGS. 5A and 5B, an optical-element 250 has mechanical mounting features. Optical-element 250 is a gradient refractive index optic with tabbed mounting features. Optical-element 250 has a mounting tab 254, a mounting tab 258, and a mounting tab 262, the mounting tabs having a thru-hole 256, a thruhole 260, and a mounting thru-hole 264, respectively. The optical-element comprises of a plurality of cured complex-dielectric inks according to the aforementioned methods of manufacture. Here the mounting tabs were manufactured in a layer-by-layer process simultaneously with the active optical area. Similar to that described above when printing the perimeter layer border, the mounting tabs have well defined edges and aspect ratios due to the ability to cure them without curing other areas.

In addition to the layer perimeter border, steep sidewalls, and mounting tabs, other physical features can be incorporated during manufacture without curing or over-curing the optically active region. Such features include alignment features, baffles, apertures, and mounting flanges.

Another advantage of the disclosed method is simultaneous printing of both mechanical features and optical features. Unlike other processes where printing of certain features must occur first, the disclosed techniques advantageously allow the printhead to remain in close proximity to the optical-element throughout the printing process thereby reducing droplet deposition travel and associated angular spatial deposition error.

One embodiment (a) is a method for inkjet printing a gradient dielectric element in a deposition and photo-polymerization process, the method comprising: providing a plurality of complex-dielectric inks that are inkjet printable including a nanocomposite ink with an organic matrix and a nanoparticle filler dispersed within, the plurality of complex-dielectric inks comprises a first complex-dielectric ink having a first photoinitiator and a second complex dielectric-ink with a second photoinitiator, the first and second complex dielectric-inks having different wavelength selective photo-polymerization absorption bands such that spectrally discrete exposure results in different degrees of polymerization of the first and second complex-dielectric inks; providing an optical source to polymerize the plurality of complex dielectric-inks; depositing droplets of the plurality of complex-dielectric inks and curing the plurality of complex-dielectric inks, wherein deposition of the plurality of layers result in a volumetric nanoparticle concentration gradient.

Another embodiment (b) is the method of embodiment a, wherein the first complex-dielectric inks is curable by a portion of the electromagnetic spectrum that does not cure the second complex dielectric-inks. Another embodiment (c) is the method of embodiment b, wherein the optical source comprises of a first optical source and a second optical source, the first optical source emission curing only the first complex-dielectric ink and the second optical source curing at least the second complex-dielectric ink. Another embodiment (d) is the method of embodiment b, wherein the optical source is a broadband emission source with a bandpass or long-pass filter with wavelength adjustable emission based on angle of the filter. Another embodiment (e) is the method embodiment a, wherein curing the plurality of complex-dielectric inks includes delivering doses of optical radiation that cures the first complex dielectric-ink without appreciably curing the second complex-dielectric ink. Another embodiment (f) is the method of embodiment e, wherein the first and second complex-dielectric ink have different concentrations of the same photoinitiator type. Another embodiment (g) is the method of embodiment a, wherein the nanoparticle filler has nanoparticles selected from BeO, $Al_2O_3$, SiC, ZnO, $SiO_2$, ZnS, $ZrO_2$, $YVO_4$, $TiO_2$, $CuS_2$, CdSe, PbS, $TeO_2$, MgO, AlN, $LaF_3$, GaSbO, nano-Diamond, $ThF_4$, $HfO_2$—$Y_2O_3$, $Yb_2O_3$, $Dy_2O_3$, $ZrO_2$—$Y_2O_3$, $Si_3N_4$, $BaY_2O_3$, KBr, $Ta_2O_5$, $HfO_2$, AlGaP, SiGe, GaAs, Au, Ag, LiF, $MoS_2$, or combinations thereof. Another embodiment (h) is the method of embodiment a, wherein the first complex-dielectric ink is optically opaque. Another embodiment (i) is the method of embodiment a, wherein a portion of the plurality of complex-dielectric inks is uncured. Another embodiment (j) is the method of embodiment i, further comprising the steps of removing the uncured complex-dielectric inks. Another embodiment (k) is the method of embodiment a, wherein the volumetric nanoparticle concentration gradient is designed for manipulation of UV, visible, NIR IR, microwave, millimeter, radio frequency waves, or combinations thereof. Another embodiment (l) is the method of embodiment a, wherein the volumetric nanoparticle concentration gradient results in a volumetric gradient refractive index. Another embodiment (m) is the method of embodiment a, wherein the volumetric nanoparticle concentration gradient results in a refractive nonlinear gradient.

Another embodiment (n) is a method of inkjet printing a gradient dielectric element in a deposition and polymerization process, the method comprising: providing a plurality of complex-dielectric inks that are photo inkjet printable including a nanocomposite ink with an organic matrix and a nanoparticle filler dispersed within; depositing droplets of the plurality of complex-dielectric inks to form a plurality of layers, at least one the plurality of layers having a layer perimeter border defining an infill area within the layer perimeter border, wherein either the layer perimeter border is at least partially cured before the infill area is deposited or the layer perimeter border is at least partially cured before the infill is at least partially cured; and wherein deposition of the plurality of layers result in a volumetric nanoparticle concentration gradient.

Another embodiment (o) is the method of embodiment n, wherein the nanoparticle filter has nanoparticles selected from BeO, $AL_2O_3$, SiC, ZnO, $SiO_2$, ZnS, $ZrO_2$, $YVO_4$, $TiO_2$, $CuS_2$, CdSe, PbS, $TeO_2$, MgO, AlN, $LaF_3$, GaSbO, nano-Diamond, $ThF_4$, $HfO_2$—$Y_2O_3$, $Yb_2O_3$, $Dy_2O_3$, $ZrO_2$—$Y_2O_3$, $Si_3N_4$, $Y_2O_3$, KBr, $Ta_2O_5$, $HfO_2$, AlGaP, SiGe, GaAs, Au, Ag, LiF, $MoS_2$, or combinations thereof.

Another embodiment (p) is the method of embodiment n, wherein the perimeter border is at least partially cured by a spatially discrete optical source. Another embodiment (q) is the method of embodiment p, wherein the spatially discrete optical source is a focused LED or laser diode. Another embodiment (r) is the method of embodiment n, further comprising depositing a radical reaction inhibitor within the inner sidewall of the perimeter border before deposition of the infill area, the radial reaction inhibitor decreasing spread of the polymerization process to the infill area during curing of the perimeter border. Another embodiment (s) is the method of embodiment r, wherein the infill area of at least one of the plurality of layers is not cured. Another embodiment (t) is the method of embodiment n, wherein the plurality of complex-dielectric inks comprises a first complex-dielectric ink having a first photoinitiator and a second complex-dielectric ink with a second photoinitiator, the first complex dielectric-ink curable by a first optical source that does not cure the second complex-dielectric ink, the second complex-dielectric ink curable by a second optical source. Another embodiment (u) is the method of embodiment t, wherein the second complex-dielectric ink is a nanocomposite ink. Another embodiment (v) is the method of embodiment t, wherein the uncured infill area is removed. Another embodiment (w) is the method of embodiment t, wherein the first complex-dielectric ink is deposited as the perimeter border, the perimeter border cured first thereby confining the second complex-dielectric ink. Another embodiment (x) is the method of embodiment t, wherein the first complex-dielectric ink has a higher viscosity than the second complex-dielectric ink. Another embodiment (y) is the method of embodiment t, wherein the first complex-dielectric ink is cured while the second complex-dielectric ink is being deposited. Another embodiment (z) is the method of embodiment n, wherein the first optical source and the second optical source are selected from filament-based sources, flash lamps, light emitting diodes, laser diodes, lasers, or combinations thereof. Another embodiment (aa) is the method of embodiment n, wherein the second complex-dielectric ink is allowed to at least partially intermix before curing.

It was noted hereinabove that nonlimiting examples of suitable nanoparticle filler material include materials selected from selected from BeO, $Al_2O_3$, SiC, ZnO, $SiO_2$, ZnS, $ZrO_2$, $YVO_4$, $TiO_2$, $CuS_2$, CdSe, PbS, $TeO_2$, MgO, AlN, $LaF_3$, GaSbO, nano-Diamond, $ThF_4$, $HfO_2$:$Y_2O_3$, $Yb_2O_3$, $Dy_2O_3$, $ZrO_2$:$Y_2O_3$, $Si_3N_4$, $Y_2O_3$, KBr, $Ta_2O_5$, $HfO_2$, AlGaP, SiGe, GaAs, Au, Ag, LiF, $MoS_2$, or combinations thereof, including those with core, core/shell, and core/shell/ligand architectures. In some examples, the nanoparticle filler materials may include nanoparticles with various aspect ratios. In some examples, the nanoparticles may be dipolar. In these and other examples, the nanoparticle filler may have nanoparticles selected from Be, AZO, Co, CuO, ZnS, $HfO_2$, $Y_2O_3$, chalcogenide glass (ChG), MgF, $SiO_2$, $BaY_2O_3$, $BaTiO_3$, $WO_3$, PbO, $Fe_3O_4$, $Fe_2O_3$, ferrites, hexaferrites, spinel ferrites, carbon nanotubes (CNT), charabaceous materials, hollow nanospheres (HN), or combinations taken from this or the preceding list.

The disclosure herein refers to polymerizable monomers and to processes that trigger material curing by polymerization of the polymerizable monomers—e.g., photopolymerization via one or more photoinitiators. In some implementations, these terms can be broadened to include scenarios in which an ink is based on a soluble polymer or oligomer, in lieu of a monomer per se, and the initiator or photoinitiator initiates a crosslinking reaction to cure the ink into a solid.

One aspect of this disclosure is directed to a method for forming a heterogeneous or gradient dielectric-property element. The method comprises: (a) providing a plurality of solution-based feedstocks, each including an organic matrix, wherein at least one of the feedstocks includes a nanoparticle filler dispersed within the organic matrix. The plurality of feedstocks comprise a first ink having a first photosensitive entity and one or more additional feedstocks having other photosensitive entities. The first and subsequent feedstocks have at least one different photosensitization absorption band, such that spectrally discrete exposure results in different degrees of curing of the first and subsequent feedstocks. The method further comprises (b) providing an electromagnetic (EM) source configured to polymerize one or more of the plurality of feedstocks; (c) depositing the plurality of feedstocks in a plurality of layers; and (e) curing at least a portion of the plurality of feedstocks, wherein deposition and subsequent curing results in regions where the complex dielectric properties are different within or between at least one of the plurality of layers.

In some examples the curing in the method above comprises one or more of photocuring, photopolymerization, photoinitiation and photo-crosslinking. In some examples the EM source is spatially patterned. In some examples the EM sources is a laser. In some examples the EM source is UV, optical, near-infrared, or infrared. In some examples the EM source is one or more of radio-frequency (RF), microwave, or millimeter-wave. In some examples one or more of the feedstocks include co-monomers that have different absorption wavelength bands, which can create a range of curing wavelength bands by mixing co-monomers with the organic matrix. In some examples one or more of the feedstocks includes a tunable photoinitiator that can be adjusted to absorb light over different wavelength bands by adjusting its structure and/or by applying external stimulus. In some examples the external stimulus includes temperature or pH. In some examples one or more of the nanoparticle fillers is coated with a surface chemical coating to control photosensitization properties between the nanoparticle and the organic matrix. In some examples one or more of the feedstocks include a monomer modified by a dye, pigment and/or nanoparticles, to absorb light in a particular wavelength band, and then transfer energy to the monomer to initiate curing, thereby varying a sensitivity of the curing according to wavelength. In some examples the method above is enacted in an oxygen-depleted environment. In some examples the oxygen-depleted environment includes one or more of an inert gas, nitrogen, or argon. In some examples the first feedstock or the subsequent feedstocks are thermally pretreated before depositing the ink onto the substrate. In some examples one or more of the nanoparticle fillers is coated with a surface chemical coating to control interfacial properties between the nanoparticle and the organic matrix. In some examples the deposition of the feedstocks is carried out using inkjet printing, aerosol jet printing, screen printing, metered fluidic deposition, or other additive manufacturing techniques. In some examples the deposition of the feedstocks is carried out using a piezoelectric or thermal inkjet printhead. In some examples the organic matrix used in one or more of the feedstocks includes one or more of benzyl methacrylate (BMA), methyl methacrylate (MMA), ethyl methacrylate (EMA), glycidyl methacrylate (GMA), butyl methacrylate (BuMA), ethoxylated bisphenol A diacrylate (EBPAD), trimethylolpropane triacrylate (TMPTA), 1,6-hexanediol diacrylate (HDDA), isobornyl acrylate (IBOA), diethylene glycol diacrylate (DEGDA), Neopentyl glycol diacrylate (NPGDA), triethylchloromethylamonium chloride (TCMDA), tricyclodecane dimethanol dimethacrylate (TCDDA), or fluoroethylene glycol diacrylate (FEGDA).

In some examples the organic matrix includes one or more of acrylate-based resins, epoxy resins, polyurethanes, methacrylate-based resins, silicone-based resins, nylon, PA-12, photoinitiator-modified nylon, acrylate- or methacrylate modified nylon, photoinitiator-modified polycarbonate (PC), acrylate- or methacrylate-modified polycarbonate, photoinitiator-modified ABS (acrylonitrile butadiene styrene). In some examples the feedstocks include one or more radiofrequency (RF) curable monomers.

In some examples the one or more of RF curable monomers include acrylates, isobornyl acrylate, 2-ethylhexyl acrylate, trimethylolpropane triacrylate, methacrylates, 2-hydroxyethyl methacrylate, 2-ethylhexyl methacrylate, vinyl acetate (VAc), vinyl ethyl ether (VEE), vinyl butyl ether (VBE), cyclohexyl methacrylate, diglycidyl ether of bisphenol A (DGEBA), isobutyl vinyl ether, vinyl caprolactam, vinyl-functionalized silicone oils or silane-functionalized silicone resins.

In some examples the one or more RF curable monomers include acrylates, isobornyl acrylate, 2-ethylhexyl acrylate, trimethylolpropane triacrylate, methacrylates, 2-hydroxyethyl methacrylate, 2-ethylhexyl methacrylate, cyclohexyl methacrylate, diglycidyl ether of bisphenol A (DGEBA), isobutyl vinyl ether, vinyl caprolactam, vinyl-functionalized silicone oils or silane-functionalized silicone resins.

In some examples the curing is done in a controlled temperature and humidity environment to control the curing process and prevent any deformation of the cured structures. In some examples one or more of the feedstocks is cured using a combination of one or more, or two or more, of thermal curing, IR curing, and UV curing. In some examples one or more of the feedstocks requires photoinitiation in two, substantially non-overlapping wavelength bands. In some examples one or more of a coumarin, stilbene, and pyrylium salt, benzophenone, acridine derivative, anthraquinone, thioxanthone, iodonium salt, metal complex, porphyrin, or phthalocyanine, benzophenone, diphenyl(2,4,6-trimethylbenzoyl)phosphine oxide (TPO), 2,2-dimethoxy-2-phenylacetophenone (DMPA), bisacylphosphine oxide (BAPO), ethyl-2,4,6-trimethylbenzoylphenylphosphinate (ETP), 2,2-dimethoxy-2-phenylacetophenone (DMPA), 2-methyl-4'-(methylthio)-2-morpholinopropiophenone (MTMP) is included as a photoinitiator in one or more of the feedstocks. In some examples one or more of the feedstocks includes a photoinitiator that requires a co-initiator or hydrogen donor to generate reactive species upon UV irradiation. In some examples a photoinitiator includes one or more Type 1 or Type 2 photoinitiators curable in the 200 to 500-nm spectral region. In some examples the photoinitiator includes Irgacure 907, Irgacure 651, Darocur 1173, Irgacure 184, camphorquinone, phenylbis(2,4,6-trimethylbenzoyl) phosphine oxide (TPO), TPO (phenylbis(2,4,6-trimethylbenzoyl)phosphine oxide), benzoin methyl ether (BME), 2,4,6-trimethylbenzoylphenylphosphine oxide (TPO-L), 2-methyl-4'-(methylthio)-2-morpholinopropiophenone (MTMP), ethyl 4-(dimethylamino)benzoate (EDAB), or benzophenone-3 (BP3). In some examples a photoinitiator is configured for curing with radiation with a wavelength longer than 700 nm and includes one or more of cyanine dyes, bis(acyl)phosphine oxide (BAPO), an iodonium salt, a triarylamine derivative, a pyridinium salt, carbon quantum dots (CQDs), bis(diphenylphosphino)benzene boron difluoride (BDP-BF2), thioxanthone-based NIR photoinitiators (TTX-NIR), or a phosphine oxide derivative. In some examples the nanoparticle fillers include a nanoceramic, nanoglass, nanotube, nanocrystal, or nanoporous material, which is sized smaller than $\frac{1}{10}$ the wavelength of intended incident light.

In some examples the nanoparticles include carbon nanoparticles. In some examples the carbon nanoparticles include carbon black, carbon nanotubes (CNT), single-wall carbon nanotubes (SWCNT), multi-wall carbon nanotubes (MWCNT), graphene, graphite, carbon dots, carbon quantum dots (CQDs), or carbon nanospheres. In some examples the nanoparticles include gold, silver, copper, zinc, iron, titanium, palladium, nickel, or aluminum. In some examples the nanoparticles include magnetic or magneto-dielectric nanoparticles. In some examples the magnetic or magneto-dielectric nanoparticles include ferrites, hexaferrites, spinel hexaferrites, spinel ferrites, iron oxide, cobalt, nickel, barium hexaferrite ($BaFe_{12}O_{19}$), nickel ferrite ($NiFe_2O_4$), cobalt ferrite ($CoFe_2O_4$), nickel cobalt ferrite ($NiCoO_{24}$), lithium zinc ferrite ($LiZnFe_4O_4$), magnetite ($Fe_3O_4$), zinc ferrite ($ZnFe_2O_4$), lithium ferrite ($LiFesO_8$), manganese ferrite ($MnFe_2O_4$), barium ferrite ($BaFe_2O_4$), strontium hexaferrite ($SrFe_{12}O_{19}$) nanoparticles. In some such examples the nanoparticle has an aspect ratio above 2:1. In some examples the nanoparticles include a cellulose nanocrystal, cellulose nanofibril, bacterial cellulose (BC), cellulose nanocrystal aerogel, aerogel, or lignin. In some examples curing at least the portion of the plurality of feedstocks includes applying an electric field to at least the portion, to align one or more nanoparticle dipoles therein. In some examples the cured structures are patterned using a laser ablation or chemical etching process to create specific patterns that can alter the electromagnetic properties of the structure. In some examples patterning the deposition of one or more of the feedstocks is aided by self-assembled monolayers (SAMs) with specific functional groups used to control surface energy, wettability, and/or adhesion. In some examples one or more of the feedstocks is immiscible with one or more of the other feedstocks. In some examples one or more of the feedstocks is hydrophobic. In some examples one or more of the feedstocks has a pH that differs by 1 from one or more of the other feedstocks. In some examples the gradient dielectric property element is configured to be part of a metamaterial, metasurface, photonic crystal, antenna, phased array antenna, gradient index (GRIN) lens, phase plate, absorber, polarizer, grating, waveguide, filter, diplexer, or resonator. In some examples the curing of one or more of the feedstocks causes a change in EM properties or behavior of the feedstock over a frequency range, including a changes in complex-dielectric properties, or related parameters such as refractive index, permeability, permittivity, and loss factors. In some examples curing of one or more of the feedstocks causes a change in physical properties of the feedstock including Vickers hardness, Youngs modulus, compressive strength, shear strength, toughness, or fatigue strength. In some examples one or more of the feedstocks are chemically modified to impart sensitivity to one of the photosensitizing wavelength bands and not one or more of the others. In some examples the method further comprises removing one or more non-polymerized feedstocks, constituents of the non-polymerized feedstocks, or solvents before subsequent layers are deposited. In some examples cured portions of the solution-based feedstocks form a structural lattice designed to impart mechanical strength, rigidity, stiffness, durability, shock dissipation, or other physical attribute into a device. In some examples the structural lattice is contiguous between two or more layers of the device. In some examples the structural lattice is formed by a packing of unit cells that may include cubic, face-centered cubic (FCC), body-centered cubic (BCC) hexagonal, honeycomb, tetragonal, orthorhombic, hexagonal close-packed (HCP). In some examples the structural lattice forms a fractal lattice pattern that exhibits self-similarity across different length scales or multi-scale lattice that that incorporates repeated patterns at multiple scales. In some examples that lattice incorporates one or more EM active regions designed to alter the shape of an incident EM wavefront. In some examples one or more EM active regions are contiguous throughout the device. In some examples the EM active regions alter the incident wavefront through: absorption, change of phase, reflection, change of wavelength, divergence, focus, or re-direction.

From the description of the present invention provided herein one skilled in the art can practice the methods in accordance with the present disclosure. Those skilled in the art to which the present invention pertains will recognize that while above-described embodiments of the inventive optical-element and method of manufacture are exemplified using particular materials others may be combined using these embodiments without departing from the spirit and scope of the present invention. Some of the embodiments explained above have certain symmetry one skilled in the art will recognize that radial symmetry is not a requirement and cylindrical and anamorphic optical-elements manufactured with the disclosed techniques.

In summary, the present invention is described above in terms of particular embodiments. The invention, however, is not limited to the embodiments described and depicted herein. Rather, the invention is limited only by the claims appended hereto.

The invention claimed is:

1. A method for forming a heterogeneous or gradient dielectric-property element, the method comprising:
providing a plurality of solution-based feedstocks, each including an organic matrix, wherein at least one of the feedstocks includes a nanoparticle filler dispersed within the organic matrix, the plurality of feedstocks comprising a first ink having a first photosensitive entity and one or more additional feedstocks having other photosensitive entities, the first and subsequent feedstocks having at least one different photosensitization absorption band, such that spectrally discrete exposure results in different degrees of curing of the first and subsequent feedstocks;
providing an electromagnetic (EM) source configured to polymerize one or more of the plurality of feedstocks;
depositing the plurality of feedstocks in a plurality of layers; and
curing at least a portion of the plurality of feedstocks, wherein deposition and subsequent curing results in regions where complex dielectric properties are different within or between at least one of the plurality of layers.

2. The method of claim 1, wherein the EM source is spatially patterned.

3. The method of claim 1, wherein the EM source is one or more of radio-frequency (RF), microwave, or millimeter-wave.

4. The method of claim 1, wherein one or more of the feedstocks include co-monomers that have different absorption wavelength bands, which can create a range of curing wavelength bands by mixing them with the organic matrix.

5. The method of claim 1, wherein one or more of the feedstocks includes a tunable photoinitiator that can be adjusted to absorb light over different wavelength bands by adjusting its structure and/or by applying external stimulus.

6. The method of claim 1, wherein one or more of the nanoparticle fillers is coated with a surface chemical coating to control photosensitization properties between the nanoparticle and the organic matrix.

7. The method of claim 1, wherein one or more of the feedstocks include a monomer modified by a dye, pigment, chromophore, molecule, functional moiety, and/or nanoparticles, to absorb light in a particular wavelength band, and then transfer energy to the monomer to initiate curing, thereby varying a sensitivity of the curing according to wavelength.

8. The method of claim 1, wherein the first feedstock or the subsequent feedstocks are thermally pretreated before depositing the ink onto the substrate.

9. The method of claim 1, wherein the feedstocks include one or more radio-frequency (RF) curable monomers, including microwave and millimeter-wave RF curable monomers.

10. The method of claim 1, wherein one or more of the feedstocks is cured using a combination of one or more of thermal curing, IR optical curing, RF curing, and UV curing.

11. The method of claim 1, wherein one or more of the feedstocks requires photoinitiation in two, substantially non-overlapping wavelength bands.

12. The method of claim 1, wherein one or more of the feedstocks includes a photoinitiator that requires a co-initiator or hydrogen donor to generate reactive species upon UV irradiation.

13. The method of claim 1 wherein the curing is achieved via one or more Type 1 or Type 2 photoinitiators curable in the 200 to 500-nm spectral region.

14. The method of claim 1, wherein a photoinitiator is configured for curing with radiation with a wavelength longer than 700 nm and includes one or more of cyanine dyes, bis(acyl)phosphine oxide (BAPO), an iodonium salt, a triarylamine derivative, a pyridinium salt, carbon quantum dots (CQDs), doped quantum dots, bis(diphenylphosphino) benzene boron difluoride (BDP-BF2), Thioxanthone-based NIR photoinitiators (TTX-NIR), or a phosphine oxide derivative.

15. The method of claim 1 wherein curing at least the portion of the plurality of feedstocks includes applying an electric field to at least the portion, to align one or more nanoparticle dipoles therein.

16. The method of claim 1, wherein patterning the deposition of one or more of the feedstocks is aided by self-assembled monolayers (SAMs) with specific functional groups used to control surface energy, wettability, and/or adhesion.

17. The method of claim 1, wherein one or more of the feedstocks is immiscible with one or more of the other feedstocks.

18. The method of claim 1, wherein one or more of the feedstocks is hydrophobic.

19. The method of claim 1, wherein one or more of the feedstocks has a polarization that differs by 10% from that of one or more of the other feedstocks.

20. The method of claim 1, wherein the curing of one or more of the feedstocks causes a change in EM properties or behavior of the feedstock over a frequency range, including a changes in complex-dielectric properties, or related parameters such as refractive index, permeability, permittivity, and loss factors.

21. The method of claim 1 further comprising removing one or more non-polymerized feedstocks, constituents of the non-polymerized feedstocks, or solvents before subsequent layers are deposited.

* * * * *